(12) United States Patent
Konishi et al.

(10) Patent No.: US 6,652,795 B2
(45) Date of Patent: Nov. 25, 2003

(54) PRODUCTION METHOD FOR SEMICONDUCTOR DEVICES USING RESIN MOLDING MOLD

(75) Inventors: Masahiro Konishi, Ikoma (JP); Hiroki Orita, Sakurai (JP); Toshiyuki Takada, Kitakatsuragi (JP)

(73) Assignee: Sharp Kabushiki Kaisha, Osaka (JP)

( * ) Notice: Subject to any disclaimer, the term of this patent is extended or adjusted under 35 U.S.C. 154(b) by 163 days.

(21) Appl. No.: 09/799,360

(22) Filed: Mar. 6, 2001

(65) Prior Publication Data

US 2001/0040283 A1 Nov. 15, 2001

(30) Foreign Application Priority Data

Mar. 6, 2000 (JP) .......................... 2000-061279
Feb. 9, 2001 (JP) .......................... 2001-034689

(51) Int. Cl.⁷ ................. B29C 45/14; B29C 70/70
(52) U.S. Cl. .................. 264/272.13; 264/272.15; 264/272.17; 264/328.2

(58) Field of Search .............. 264/272.11, 272.13, 264/272.14, 272.15, 272.17, 275, 328.2, 328.4, 328.5; 425/116, 129.1, 544; 438/126, 127; 29/841

(56) References Cited

U.S. PATENT DOCUMENTS

| 4,370,292 A | * | 1/1983 | Yanase et al. ......... 264/272.11 |
| 4,996,170 A | * | 2/1991 | Baird .................... 264/272.17 |
| 5,955,021 A | * | 9/1999 | Tiffany, III ........... 264/272.11 |
| 6,000,924 A | * | 12/1999 | Wang et al. ............... 425/125 |

FOREIGN PATENT DOCUMENTS

JP          5-8268          1/1993

* cited by examiner

Primary Examiner—Angela Ortiz
(74) Attorney, Agent, or Firm—Nixon & Vanderhye P.C.

(57) ABSTRACT

A resin molding die includes: a cavity; a resin inlet through which a liquid resin to be cured is injected into the cavity; and an air vent through which air is released to an exterior space of the resin molding die during injection of the resin, the air vent being provided on an opposite side from the resin inlet with respect to the cavity.

14 Claims, 7 Drawing Sheets

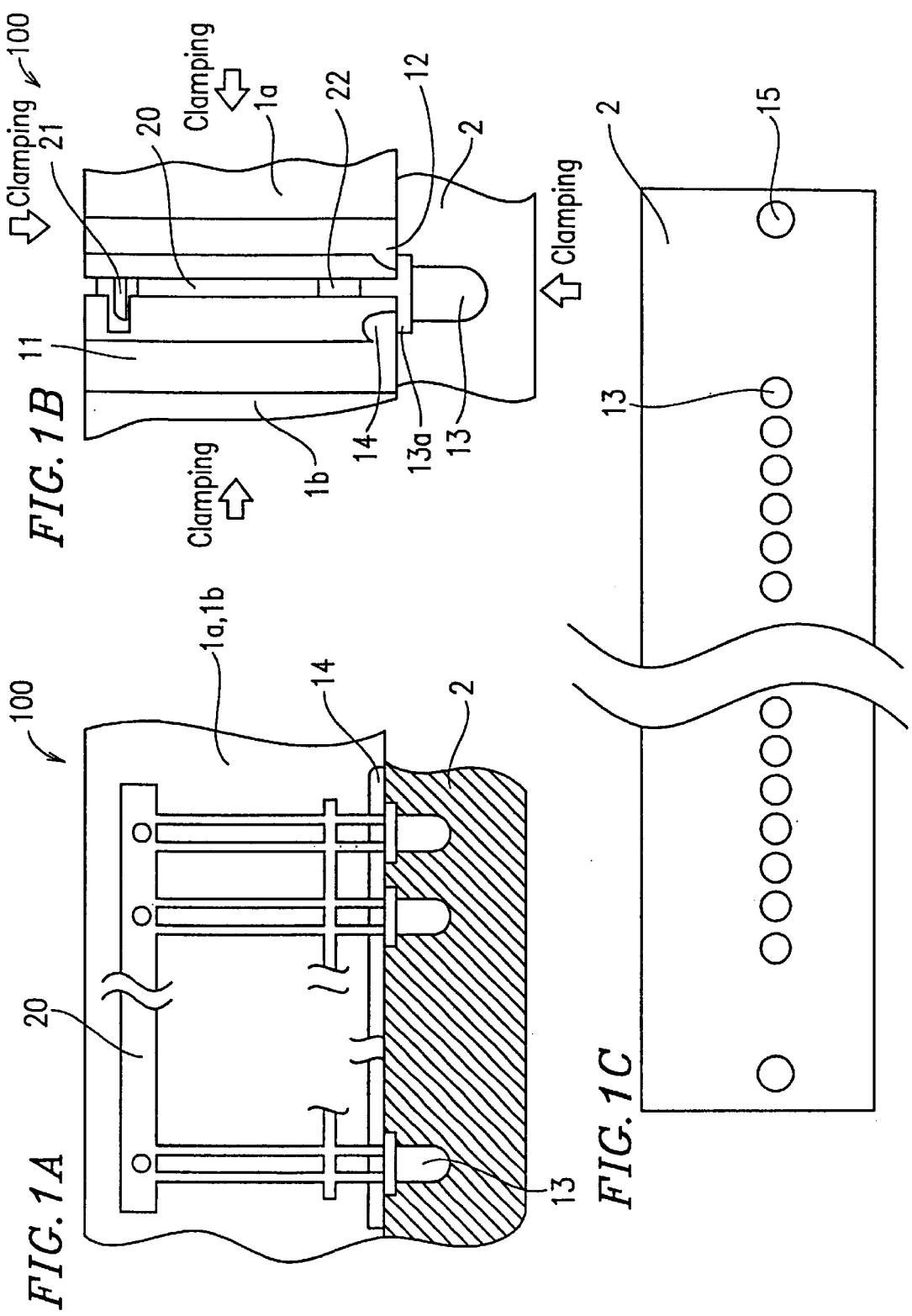

Runner/gate — Product — Air vent

Upper die / Lower die / Air vent

PRODUCTION METHOD FOR SEMICONDUCTOR DEVICES USING RESIN MOLDING MOLD

BACKGROUND OF THE INVENTION

1. Field of the Invention

The present invention relates to a resin molding die for use in the molding-based resin encapsulation of a semiconductor device, and a production method for semiconductor devices employing such a resin molding die. In particular, the present invention relates to a production method for semiconductor devices employing a high-fluidity liquid thermosetting resin as an encapsulation resin, and a resin molding die for use with such a production method.

2. Description of the Related Art

Conventionally, resin encapsulation of semiconductor devices is achieved by: (1) casting molding, (2) transfer molding, or (3) injection molding.

(1) Casting molding. This technique involves: pouring a liquid thermosetting resin into a curing cast of PPS (polyphenylene sulfide), TPX (transparent plastic material for optics), or the like; mounting semiconductor devices and inserting wire-bonded lead frames; and heating the complex in an oven.

(2) Transfer molding. Under this technique, a resin called "B stage resin", which results after the reaction of a thermosetting resin is interrupted halfway, is used. At molding, this resin is liquefied by the application of heat and pressure, poured into a heated casting die, and then allowed to thermally cure.

(3) Injection molding. This technique chiefly employs a thermoplastic resin as an encapsulation material. The encapsulation material is liquefied under a high pressure, poured into a heated casting die, and then allowed to cool.

Conventionally, the injection molding technique has only employed thermoplastic resins. However, the development of liquid thermosetting resins which have an faster reaction rate has allowed an injection molding technique employing a liquid thermosetting resin.

However, the aforementioned conventional techniques have the following problems.

(1) When the casting molding technique is used to mold an epoxy resin (a chief material which is currently used as an encapsulation resin), there is a problem in that the epoxy resin requires a long curing time for a polyaddition reaction to occur; this step bottlenecks the production efficiency. Recently, radical reaction type resins which require a relatively short curing time are also studied. However, since this type of resins exhibit a substantial sink due to cure-related shrinkage, such resins have not been put to practical use.

(2) Since the transfer molding technique uses a B stage resin, i.e., a resin which results after the reaction of a thermosetting resin is interrupted halfway, such a resin must be stored in a frozen state, adding to the transportation and storage costs. Such a resin also requires a long curing time for a polyaddition reaction to occur.

(3) When the injection molding technique is used for encapsulating a semiconductor device with a thermoplastic resin, the high resin injection pressure used may break the wires which are used for wire-bonding a semiconductor device and a lead frame. In order to prevent this problem, a method has been proposed (Japanese Publication for Opposition No. 4-40870) in which a low-pressure injection is first performed to produce resin for protecting the wires, and then the actual molding of an external shape follows. However, the proposed technique requires some consideration in connection with a molding cycle time, and an increased number of molding dies must be used; therefore, this technique has yet to be introduced to actual mass production lines. Moreover, the high level of heat resistance and humidity resistance which is required for a semiconductor device encapsulation resin cannot be expected from a transparent thermoplastic resin due to its resin characteristics.

On the other hand, when the injection molding technique is used for encapsulating a semiconductor device with a liquid thermosetting resin, it is possible to protect wires by previously allowing a resin to adhere to the wires and curing the resin (called a "pre-dip curing technique"). However, according to this technique, the viscosity of the resin has been lowered due to the die heat when the resin is injected at a high injection pressure. As a result, the resin may leak from the parting faces of the molding die, allowing flashes to form.

SUMMARY OF THE INVENTION

A resin molding die according to the present invention includes: a cavity: a resin inlet through which a liquid resin to be cured is injected into the cavity; and an air vent through which air is released to an exterior space of the resin molding die during injection of the resin, the air vent being provided on an opposite side from the resin inlet with respect to the cavity.

In one embodiment of the invention, the resin is a thermosetting resin; and the air vent has an interspace of such dimensions that when the resin molding die is heated to or above a curing temperature of the thermosetting resin, air is allowed to be released to the exterior space of the resin molding die but that the resin cures and remains within the resin molding die.

In another embodiment of the invention, the air vent has an interspace of such dimensions that the resin flows at a pressure which is in the neighborhood of a pressure imposed by the weight of the resin.

In still another embodiment of the invention, the air vent has an interspace of such dimensions that the resin being filled in the cavity expels air to the air vent, and that the resin cures within the air vent without leaking into the exterior space of the resin molding die.

In still another embodiment of the invention, the resin is a thermosetting resin; and at least a portion of the resin inlet is in an open state when the resin molding die is heated to or above a curing temperature of the thermosetting resin during injection of the resin.

A method for producing a semiconductor device according to the present invention includes the steps of: setting a semiconductor device in a cavity of a resin molding die; injecting a thermosetting resin from a resin injection nozzle into the cavity, through a resin inlet of the resin molding die and a gate, at a pressure which is equal to or greater than a pressure imposed by the weight of the thermosetting resin and which is equal to or less than about 2 kg/cm$^2$; and curing the thermosetting resin to encapsulate the semiconductor device within the thermosetting resin.

In one embodiment of the invention, the step of injecting the thermosetting resin includes lowering a viscosity of the thermosetting resin to about 3000 cps or less so that the thermosetting resin can pass through the gate at a pressure which is equal to or greater than the pressure imposed by the weight of the thermosetting resin and which is equal to or less than about 2 kg/cm$^2$.

In another embodiment of the invention, the step of injecting the thermosetting resin includes injecting the thermosetting resin while heating the resin molding die to or above a curing temperature of the thermosetting resin.

In still another embodiment of the invention, the step of injecting the thermosetting resin includes injecting the thermosetting resin while maintaining the resin molding die below a curing temperature of the thermosetting resin: and the step of curing the thermosetting resin includes heating the resin molding die to or above the curing temperature of the thermosetting resin.

In still another embodiment of the invention, the step of injecting the thermosetting resin includes providing a space between the resin inlet and the resin injection nozzle so as to ensure that the resin inlet is not closed off by the resin injection nozzle when the resin molding die is heated to or above a curing temperature of the thermosetting resin during injection of the resin.

In still another embodiment of the invention, the step of injecting the thermosetting resin includes cooling the resin injection nozzle so as to be maintained at a temperature sufficiently below a curing temperature of the thermosetting resin.

In still another embodiment of the invention, the thermosetting resin is a resin which is obtained by adding a radical polymerization initiator or a cationic polymerization initiator to at least one main component selected from the group consisting of: a liquid epoxy resin; a liquid vinyl ester resin; an allyl resin; and a low-viscosity unsaturated polyester resin.

In still another embodiment of the invention, the thermosetting resin is a transparent resin; and the semiconductor device is a light receiving/emitting device.

Epoxy resins, which have conventionally been used as thermosetting resins for semiconductor device encapsulation, require a long curing time for a polyaddition reaction to occur. On the contrary, the present invention allows the use of a radical reaction-type resin or a cationic polymerization-type resin, so that the reaction time can be substantially reduced. Such resins, which will not react unless a certain level of heat is applied thereto, do not need to be stored in a frozen state unlike the B-stage resins.

Such resins, when used for casting molding, may exhibit some sinking due to cure-related shrinkage. However, when such resins are used for injection molding, the continuous supply of resin prevents the occurrence of sinking because any lack of resin is always compensated for. Thus, injection molding is suitable for the molding of a rapid-curing resin.

Yet, using a liquid thermosetting resin for the encapsulation of a semiconductor device still invites problems such as flash formation due to a high injection pressure.

Thus, the inventors conducted vigorous research to develop a technique for injecting a liquid thermosetting resin into a molding die at a low injection pressure, thereby arriving at the present invention.

Thus, the invention described herein makes possible the advantages of (1) providing a resin molding die which enables low-cost resin molding without allowing resin sink, wire breakage, or flash formation to occur; and (2) providing a production method for semiconductor devices using such a resin molding die.

These and other advantages of the present invention will become apparent to those skilled in the art upon reading and understanding the following detailed description with reference to the accompanying figures.

BRIEF DESCRIPTION OF THE DRAWINGS

FIGS. 1A and 1B are cross-sectional views showing a resin molding die and various components associated therewith, according to one embodiment of the present invention. FIG. 1C is a plan view corresponding to FIGS. 1A and 1B.

DESCRIPTION OF THE PREFERRED EMBODIMENTS

Figure 2A:
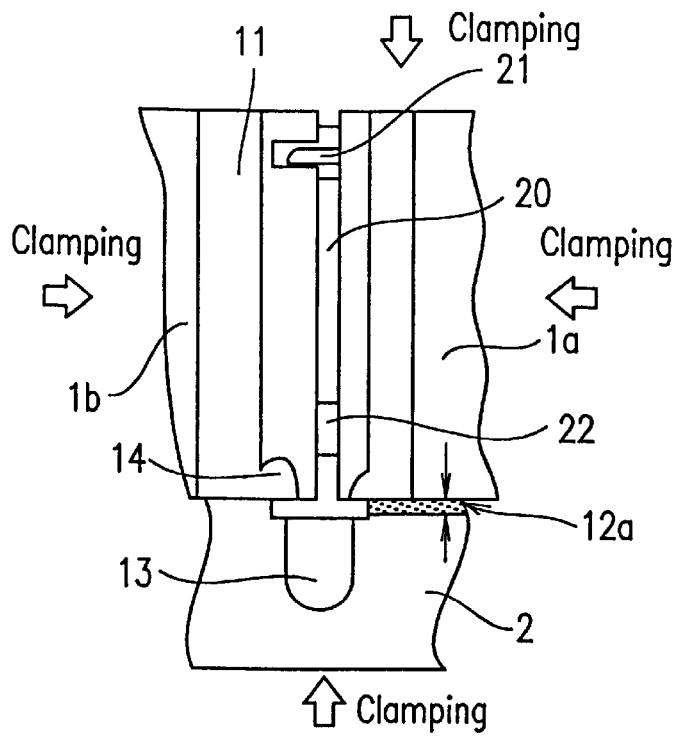
FIGS. 2A and 2C are cross-sectional views showing a resin molding die and various components associated therewith, according to another embodiment of the present invention.
Figure 2B:
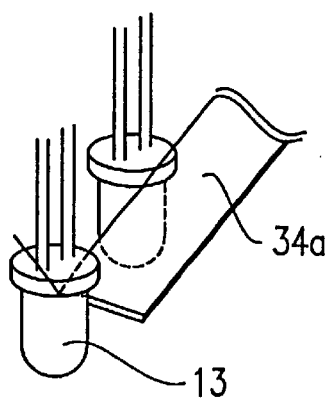
FIG. 2B is a perspective view illustrating a state occurring after resin has been injected into the molding die.

Hereinafter, the principles of the present invention will be described.

Examples of commonly used molding techniques include transfer molding, injection molding, and the like. These techniques require: (1) a very high clamping pressure (about 30 to about 40 tons); (2) a very high injection pressure (about 1 ton with a tablet having about Φ40 mm); and (3) highly precise molding dies.

Epoxy resins, which are generally used as resin for encapsulating a semiconductor device or the like, have a relatively slow reaction rate, and their cure time may span between about 5 and about 10 minutes (although it depends on the package size). Due to the slow cure rate of such resins, in the presence of wide die openings (e.g., die parting faces, air vents, or the like), there may be a lingering flow of resin until the completion of curing. The high injection pressure used also aggravates this problem.

Furthermore, the finishes of molding products may be largely dependent on the resin curing characteristics and the dimensions of internal features within the molding die (runners, gates, air vents, etc.). It is very difficult to optimize the molding conditions so as to maintain a good balance between molding product formation and resin flash formation. In extreme cases, it may become necessary to modify the die shape or even create a new molding die.

Although air vents are also employed in conventional molding techniques, their size is typically about 1 mm wide and about 0.01 mm deep.

According to the present invention, an air vent is provided in a resin molding die for the molding processes, the air vent being situated on the opposite side from a resin inlet with respect to a cavity. At the time of resin injection, air is allowed to be released through the air vent to the exterior space of the molding die. As a result, it becomes possible to inject a resin into the molding die via low-pressure injection (low pressure pouring or casting). Since a low-pressure injection occurs, there is no need to perform an intense clamping for preventing resin leakage outside the molding die (for preventing the formation of resin flashes at the parting faces). Therefore, a highly precise molding die is not a requirement, unlike under in conventional techniques. Thus, the production facility can be simplified, and the die machining precision can be lowered to enable reduction in the overall cost.

The air vent may be obtained by providing a spool-like channel in the molding die, as described in examples below, whereby an open system is realized. Alternatively, the air vent may simply be an interspace between an upper die and a lower die.

In the case where the air vent is an interspace between an upper die and a lower die, the interspace may be prescribed to be of such dimensions that when the molding die is heated to or above the curing temperature of a thermosetting resin, air is allowed to be released through the air vent to the exterior space of the molding die but that the resin cures before leaking out to the exterior space of the molding die. As a result, it becomes possible to inject a resin into the molding die via low-pressure injection. Even if the air vent is configured so as to have a larger cross-sectional area than that of an air vent used in conventional techniques, the dimension along the Z direction of the air vent may still be reduced (i.e., the distance between the upper and lower dies can be reduced), so that the resin will cure in a thermally efficient manner. This may cause flashes to be formed outside the cavity. The flashes thus formed can prevent resin from leaking out to the exterior space of the molding die after air is released through the air vent to the exterior space.

In the case where the air vent is a spool-like channel provided in the molding die, on the other hand, the size or diameter of such an air vent is preferably not made very large. An excessive large air vent of this type will incur a large amount of resin to be spent for the air vent, relative to that spent for the actual resin product. This may bottleneck the mold cure time of the overall mold, and result in an increase in the amount of resin used (i.e., the amount of wasted resin).

Specifically, a spool-like air vent may be provided on the opposite side from a resin inlet with respect to a cavity, such that the injected resin will flow at a pressure which is in the neighborhood of a pressure imposed by its own weight (hereinafter referred to as "self-weight pressure"). The air vent serves as a passage for resin, so that the injected resin flows, at a pressure which is in the neighborhood of a pressure imposed by its own weight, from the cavity into the air vent. As a result, it is possible to inject a resin into the molding die via low-pressure injection.

Figure 7:
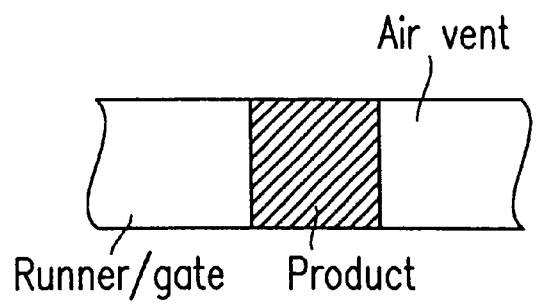
FIG. 7 is a cross-sectional view illustrating an air vent according to the present invention.

The air vent according to the present invention is sized larger than air vents employed in conventional techniques. For example, a relatively large air vent and gate as shown in FIG. 7 may be provided, and a portion of the runner may be integrated with the product, according to the present invention.

The products shown herein are for illustrative purposes only, and not in any way limitative. The present invention is applicable to a wide range of products. For example, light emitting diodes may be implemented as lead frame types (e.g., cannon ball-like configurations) or surface mount types (e.g., substrate-like configurations), just to name a few. The runner, gate, and air vent may also be in different positions or shapes depending on the product shapes. In particular, in the case where resin encapsulation is performed for a product having a substrate-like configuration, a runner/gate, an air vent, and a product may be formed so as to have a cross-sectional shape as shown in FIG. 7, and the product portion may later be cut out for use.

The interspace constituted by the air vent may be prescribed to be of such dimensions that when resin is filled in the cavity, air within the cavity is expelled to the air vent by the injected resin, but that the resin cures within the air vent before leaking out to the exterior space of the molding die. For example, the air vent may have a cross-sectional area of about 0.2 mm$^2$ or more, although the specific dimensions of the air vent may depend on the desired package configuration. As a result, it becomes possible to inject a resin into the molding die via low-pressure injection while expelling air from within the cavity to the air vent. Moreover, the resin can be efficiently cured within the air vent so as to form flashes therein, thereby preventing the resin from leaking out to the exterior space of the molding die.

Figure 8:
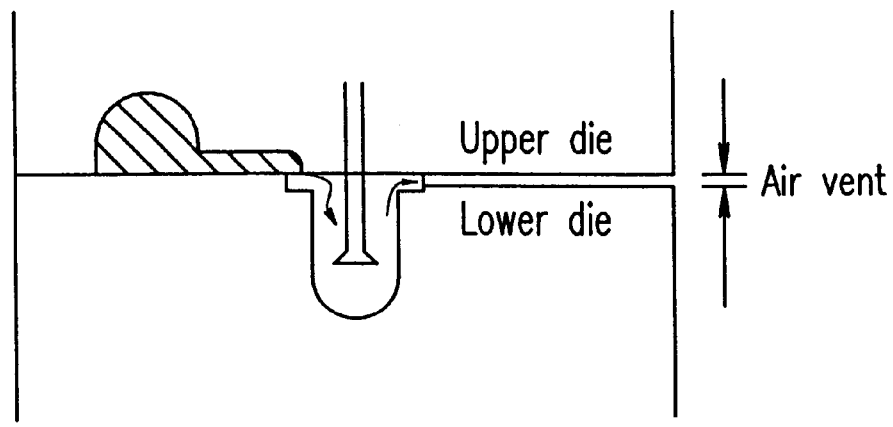
FIG. 8 is a cross-sectional view illustrating the structure of an air vent in a resin molding die according to another embodiment of the present invention.

The size of the air vent depends on the product configuration. FIG. 8 illustrates an air vent structure adapted to a given product configuration, where the air vent is an interspace between parting faces of the molding die. In one embodiment of the present invention, the resin which has flowed into the air vent ultimately forms flashes. Note that conventional molding dies are sized so as to prevent flashes. On the other hand, the resin molding die according to the present invention may be sized so as to allow flash formation to occur therein. The reason why the air vent may be sized so as to be larger according to the present invention than in conventional techniques while preventing resin from leaking out to the exterior space of the molding die is that the present invention employs a resin having a rapid cure rate.

The present invention provides no upper limit for the air vent size.

In addition, the resin inlet may be sized so as to leave some space between the inner wall of the resin inlet and a resin injection nozzle which is used during the injection of resin, so that the resin inlet is not closed off by the resin injection nozzle when the molding die is heated to or above the curing temperature of the thermosetting resin used. As a result, the air within the molding die is expelled by the resin so as to be released through the inlet as well (i.e., through the space between the inner wall of the inlet and the resin injection nozzle), thereby escaping to the exterior space of the molding die. Thus, it is possible to inject a resin into the molding die via low-pressure injection.

Now, a method for encapsulating a semiconductor device using the aforementioned resin molding die will be described.

A liquid thermosetting resin is injected from a resin injection nozzle, via a resin inlet of the molding die, through a gate, into a cavity of the molding die at a pressure which is equal to or greater than the self-weight pressure and which is equal to or less than about 2 kg/cm$^2$. The resin which is forced out into the cavity at such a low pressure moves with a relatively slow injection rate, and therefore cures before moving out of the air vent and reaching the exterior space of the molding die. Thus, it is possible to prevent flash formation outside the molding die. Furthermore, since the resin is injected into the molding die at a relatively low pressure, there is no need to perform a pre-dip curing for preventing wire breakage, which is one problem associated with injection molding.

The viscosity of the resin used in the present invention is preferably equal to or less than about 3000 cps, for example, in order to ensure that the injected thermosetting resin can pass through the gate at a pressure which is equal to or greater than the self-weight pressure and which is equal to or less than about 2 kg/cm$^2$.

By constantly maintaining the molding die at temperatures which are equal to or greater than the curing temperature of the thermosetting resin to be injected, it becomes unnecessary to rapidly heat or cool the molding die, thereby facilitating temperature control.

Alternatively, a resin may be injected after controlling the die temperature to a temperature below the curing temperature of the thermosetting resin to be injected, and then increasing the die temperature so as to be equal to or greater than the curing temperature of the thermosetting resin, it becomes possible to stably inject a resin into a multitude of cavities from a single nozzle. In this case, it is preferable to somewhat increase the viscosity of the resin to ensure that the resin will not leak outside the molding die during resin injection. However, in embodiments where air is released through an interspace between upper and lower dies (as described later), the narrowness of the interspace allows a low-viscosity resin to be used because the resin will quickly cure due to the good thermal efficiency associated with such a narrow interspace. Therefore, thin flashes may be allowed to form in the interspace and later removed.

Since the present invention chiefly employs injection molding techniques, although no limitation is intended, the amount of resin to be injected may be predetermined and the resin may be measured up to that amount each time before injection. The predetermined amount of resin to be injected may be, for example, the design value for the inlet (spool)/runner/product+α (where α may be about 20% of the design value). Furthermore, if the inlet is not hermetically sealed, resin may flow back out of the inlet depending on factors such as the nozzle diameter, resin viscosity, etc., even if the injection is carried out above a certain pressure level.

It is preferable to leave some space between the resin injection nozzle and the inner wall of the resin inlet, so that the resin inlet is not closed off by the resin injection nozzle during resin injection when the molding die is heated to or above the curing temperature of the thermosetting resin used. As a result, the air within the molding die is expelled by the resin so as to be released through the inlet as well (i.e., through the space between the inner wall of the inlet and the resin injection nozzle), thereby escaping to the exterior space of the molding die.

Furthermore, in order to ensure that resin will not cure within the resin injection nozzle after repetitive injections, it is preferable to cool the resin injection nozzle to a temperature which is sufficiently lower than the curing temperature of the thermosetting resin used.

Examples of the thermosetting resin used in the present invention include: (1) liquid epoxy resins such as glycidylether type resins, glycidylester type resins, glycidylamine type resins, linear aliphatic epoxides, and alicyclic epoxides; (2) liquid vinyl ester resins such as acrylic ester type or methacrylic ester type vinyl ester resins; (3) allyl resins such as polystyrene; and (4) low-viscosity unsaturated polyester resins. By employing a radical reaction-type resin or a cationic polymerization-type resin which may be obtained by adding a radical polymerization initiator or a cationic polymerization initiator to the above-listed resins, the reaction time can be substantially reduced. Such resins, which do not react unless a certain level of heat or above is applied thereto, are convenient for storage and transportation purposes.

By employing a transparent resin as such a thermosetting resin, it is possible to produce high-quality light receiving/emitting devices at low costs.

Hereinafter, embodiments of the present invention will be generally described first, followed by specific examples.

The following description will be directed to embodiments employing a liquid resin whose main component is a liquid vinyl ester resin of the composition shown in Table 1:

TABLE 1

| Product name | Manufacturer | Component ratio (wt %) |
| --- | --- | --- |
| 3000M | Kyoeisha Kagaku Ltd. | 40 |
| BP-2EM | Kyoeisha Kagaku Ltd. | 40 |
| benzylmethacrylate | | 5 |
| organic peroxides | | 2 |
| other additives | | 8 |

In Table 1, 3000M and BP-2EM are vinyl ester resins.

Alternatively, any other liquid thermosetting resin may be used, such as a liquid epoxy resin, a liquid vinyl ester resin, an allyl resin, or a low-viscosity unsaturated polyester resin.

FIGS. 1A and 1B are cross-sectional views showing a resin molding die 100 and various components which are used in this illustrative embodiment. FIG. 1C is a corresponding plan view. The resin molding die 100 includes three parts: an upper right die 1a, an upper left die 1b, and a lower die 2.

A lead frame 20, which may be positioned relative to a lead frame positioning pin 21, is interposed between the upper right die 1a and the upper left die 1b, and the upper right die 1a and the upper left die 1b are clamped together. Then, the upper right die 1a and the upper left die 1b, which may be together positioned relative to upper die positioning pins 15, are clamped onto the lower die 2. Reference numeral 22 denotes a lead frame tie bar.

The lower die 2 includes multiple cavities (products) 13. A resin which is injected from the resin inlet (spool) 11 provided in the upper left die 1b is injected, through a runner 14 and gates 13a, into the multiple cavities 13.

Opposite from the resin inlet (spool) 11 with respect to the cavities 13, an air vent 12 which has a similar shape to that of the spool 11 is provided for allowing air to be released through the air vent 12 to the exterior space of the molding die. It will be appreciated that the position of the resin inlet 11 is not limited to the direct opposite of the air vent 12 with respect to the cavities 13. As a result, it becomes possible to inject a resin into the molding die via low-pressure injection. The interspace (i.e., diameter in this illustrative example) constituted by the air vent 12 is preferably made greater than the diameter of the runner 14 for facilitating resin flow. An excessively large interspace constituted by the air vent 12 would result in a waste of resin; however, this problem can be addressed by measuring a predetermined amount of resin at the time of injection.

In an alternative embodiment, as shown in FIG. 2A, an air vent slit 12a may be provided on the opposite side from the spool 11 with respect to the cavities 13. The interspace constituted by the air vent slit 12a can be adjusted by controlling how close together an upper die 1a and a lower die 2 are clamped.

Figure 2C:
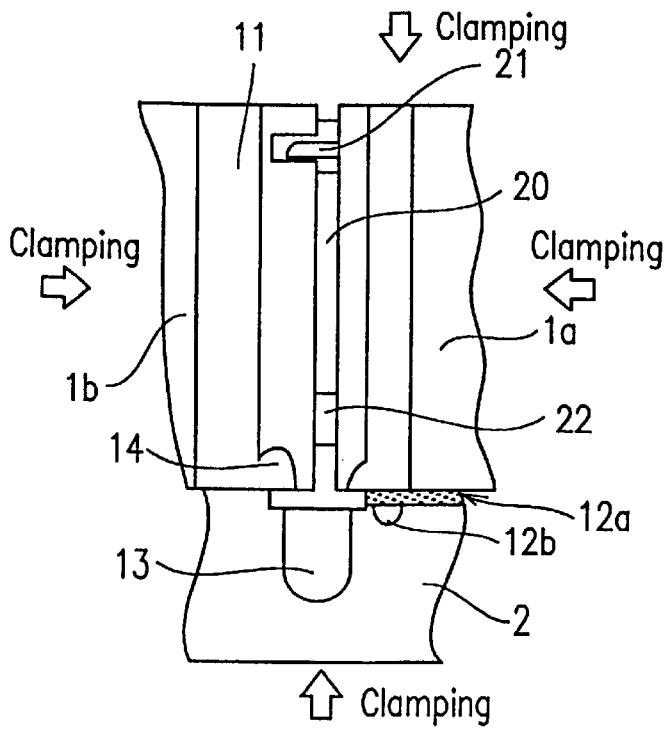

The interspace constituted by the air vent slit 12a is preferably of such dimensions that when the molding die is heated to or above the curing temperature of the thermosetting resin used, air is allowed to be released through the air vent slit 12a to the exterior space of the molding die, while the resin cures before leaking out to the exterior space of the molding die. A good thermal efficiency can be obtained by using a narrow air vent slit 12a, so that the resin will cure quickly. Therefore, a thin flash 34a may be deliberately allowed to form at the air vent slit 12a and removed later. Alternatively, a resin bin 12b may be provided as shown in FIG. 2C in order to prevent the resin from leaking out to the exterior space of the molding die.

The preferable dimension range for the interspace constituted by the air vent slit 12a may vary depending on factors such as the reaction speed, surface energy, and the like of the resin. If the reaction speed of the resin is high, the resin can easily cure, so that the interspace constituted by the air vent slit 12a may be increased. The interspace constituted by the air vent slit 12a can also be increased if the resin has a great surface energy. The interspace constituted by the air vent slit 12a can be empirically determined. For example, if the resin has a gelation time of about 2 to 5 seconds on a substrate which is heated to 150° C., an air vent slit 12a having an area of about 0.2 mm$^2$ will be adequate.

Furthermore, the spool 11 preferably has a greater diameter than that of a resin injection nozzle so as to leave some space between the resin injection nozzle and the inner wall of the spool 11 (so that the resin inlet is not closed off by the resin injection nozzle during resin injection) when the molding die is heated to or above the curing temperature of the thermosetting resin used. The reasons for this are described in detail below.

Figure 3A:
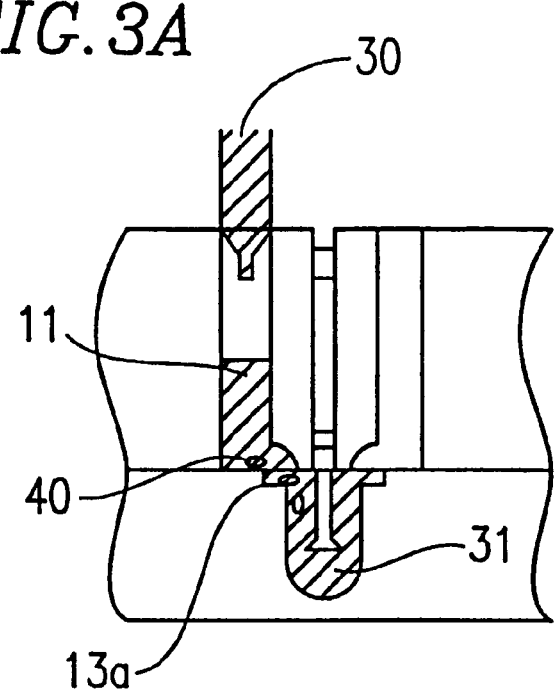
FIGS. 3A and 3B are cross-sectional views illustrating a process of injecting resin into a resin molding die according to one embodiment of the present invention.
Figure 3B:
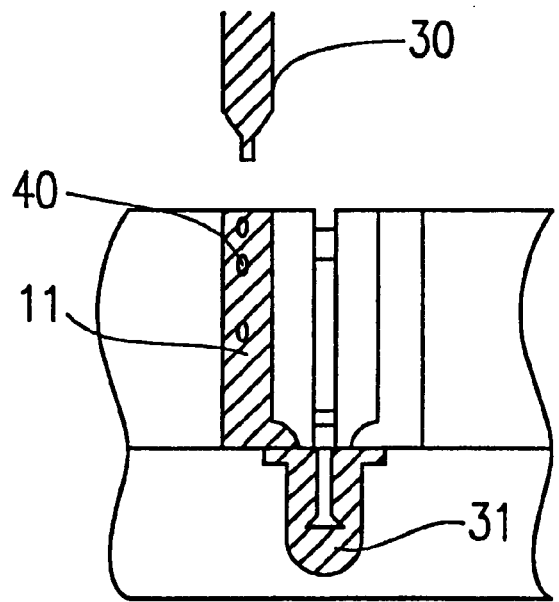

Referring to FIG. 3A, if no space is provided between the resin injection nozzle 30 and the spool 11, the nozzle 30 closes off the spool 11, so that some air 40 may be left in the vicinity of the gate 13a. The air 40 may be released by retracting the nozzle 30 as shown in FIG. 3B. However, it is difficult to achieve low-pressure injection by first injecting the resin 31 while the spool 11 is closed off by the nozzle 30 (as shown in FIG. 3A) and then retracting the nozzle 30 (as shown in FIG. 3B) because extra pressure will be applied during the resin injection.

Figure 4A:
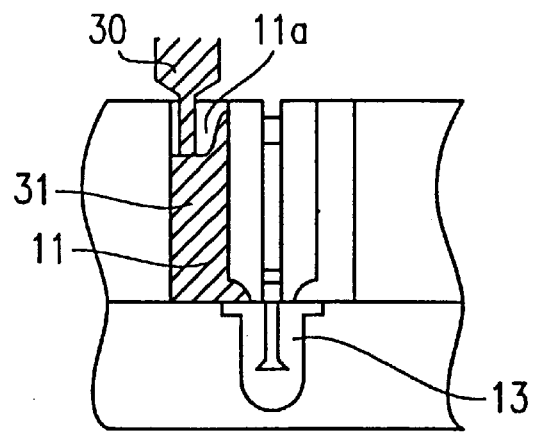
FIGS. 4A, 4B, and 4C are cross-sectional views illustrating a process of injecting resin into a resin molding die according to one embodiment of the present invention.
Figure 4B:
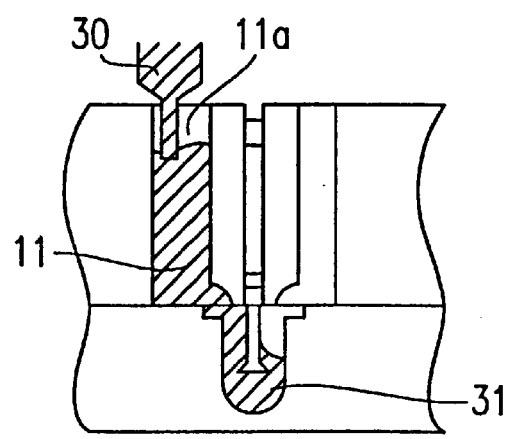
Figure 4C:
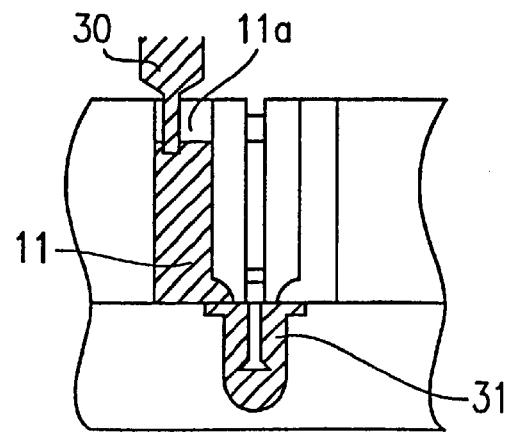

On the contrary, by ensuring that there is a space 11a between the inner wall of the spool 11 and the resin injection nozzle 30 as shown in FIG. 4A, the resin will be elevated into the space 11a between the nozzle 30 and the inner wall of the spool 11, enabling low-pressure injection. As a result, the resin 31 enters the cavity 31 as shown in FIGS. 4B and 4C. After injecting the resin 30, by retracting the nozzle 30 before the resin 31 cures, the remaining air in the cavity 13 can travel upward so as to be released through the space 11a between the nozzle 30 and the inner wall of the spool 11. Since the spool 11 is likely to accommodate much more resin than in any interspace such as an air vent, the resin will not cure while filling the cavity or the spool.

By ensuring that the spool 11 is not closed off by the resin injection nozzle 30, i.e., so that the spool 11 is at least in a partially open state, there is an advantage in that air can be effectively released from this portion. Furthermore, there is also an additional advantage in that the resin injection occurs, rather than by virtue of the injection pressure which is applied to the resin, but by virtue of a pressure equivalent to a resin injection velocity resulting from the injection pressure plus the weight of the resin itself; as a result, low-pressure molding can take place. This is because the open resin injection inlet allows the resin to flow back out of the inlet, even if the resin is injected above a certain pressure level.

The space 11a can also be empirically determined. For example, if the resin has a gelation time of about 2 to 5 seconds on a substrate which is heated to 150° C., a space 11a having a width of about 1 mm to about 2 mm will be adequate.

Figure 5A:
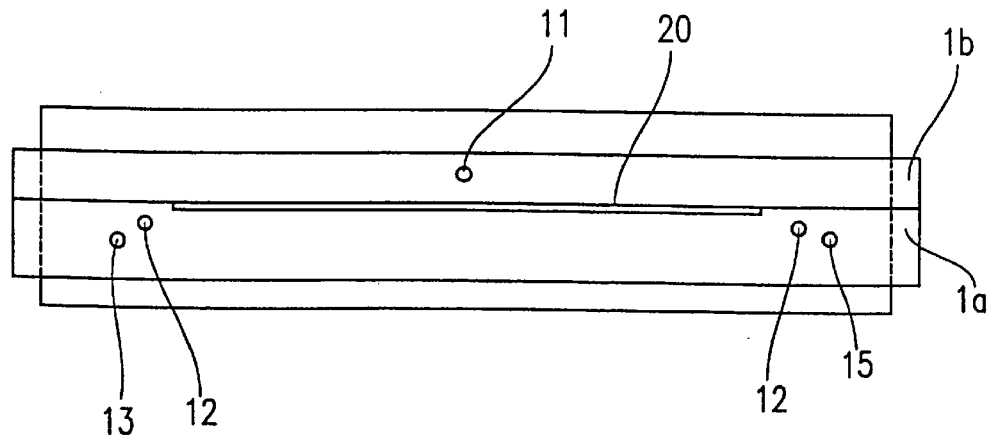
FIG. 5A is a plan view showing the relative positions of a spool and an air vent in a resin molding die according to yet another embodiment of the present invention.
Figure 5B:
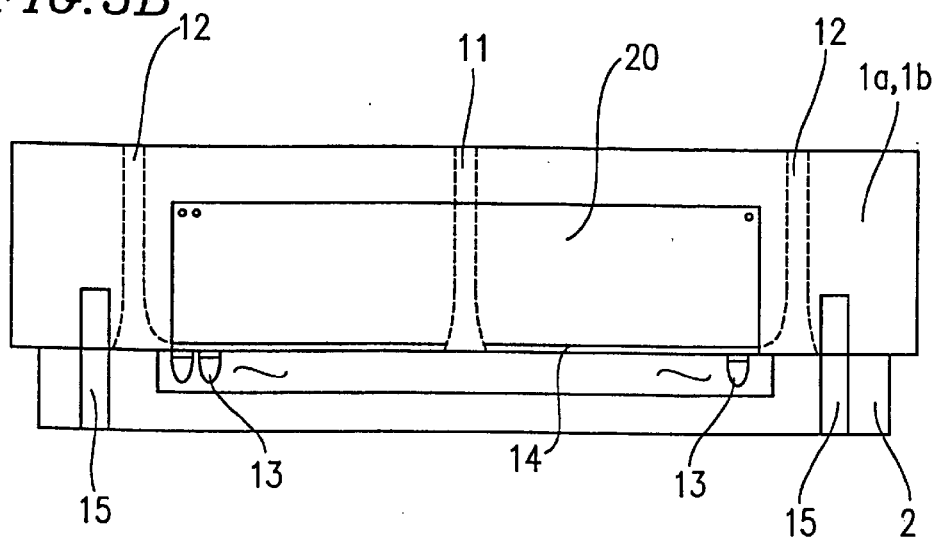
FIGS. 5B and 5C are cross-sectional views corresponding to FIG. 5A.
Figure 5C:
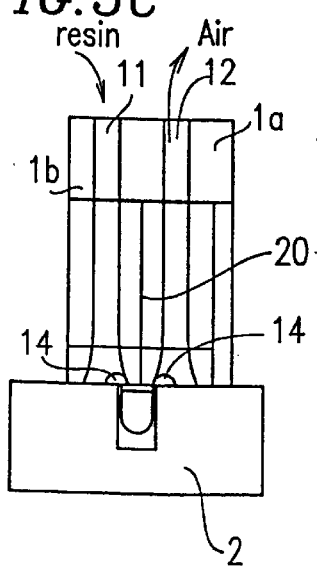
Figure 5D:
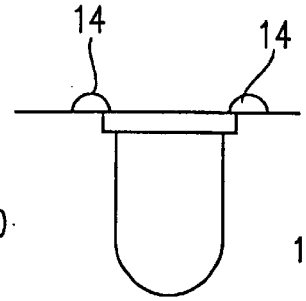
FIG. 5D is a partially enlarged cross-sectional view corresponding to FIG. 5A.
Figure 5E:
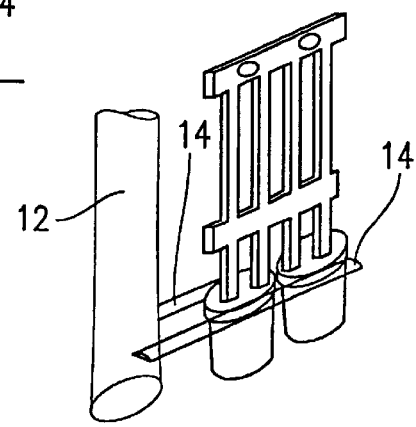
FIG. 5E is a partially enlarged perspective view corresponding to FIG. 5A.

In order to achieve an efficient resin injection into multiple cavities, as shown in FIGS. 5A to 5C, the spool 11 is preferably provided in a central portion of the runner 14, and the air vents 12 are preferably provided at both ends of the runner 14. In this case, as shown in FIGS. 5C to 5E, the resin which is injected from the central spool 11 passes through the runner 14 so as to be injected into the respective cavities 13. As a result, air is released from the air vents 12 at both ends.

Hereinafter, specific examples of the present invention will be described, in which resin encapsulation is performed for an LED lamp by using the liquid thermosetting resin and the resin molding die as described above.

EXAMPLE 1

In Example 1 of the present invention, a case will be described in which the temperature of the molding die is increased to or above the curing temperature of the resin used.

Figure 6A:
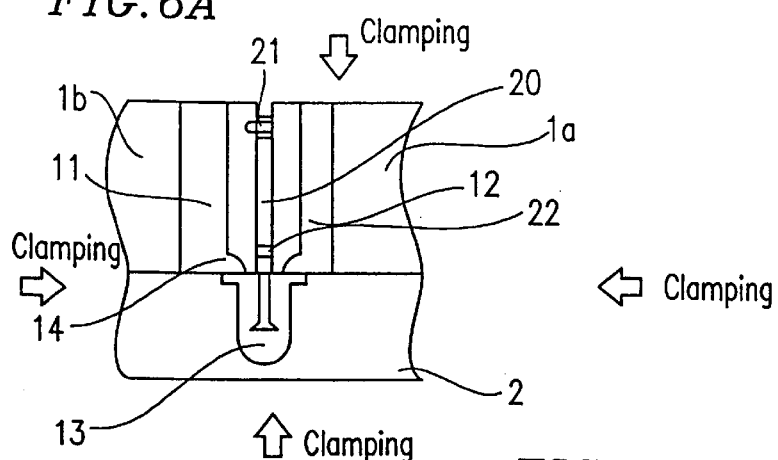
FIGS. 6A, 6B, 6C, 6D, 6E, 6F, and 6G are cross-sectional views illustrating a method for producing a semiconductor device according to the present invention.

First, as shown in FIG. 6A, a lead frame 20 for an LED lamp, to which a semiconductor device has been mounted and wire-bonded, is positioned relative to a lead frame positioning pin 21 provided in an upper right die 1a. Then, an upper left die 1b is attached, and the upper right die 1a and the upper left die 1b are clamped together along the lateral direction. Then, the tip end of the lead frame 20 is inserted into a cavity 13 provided in a lower die 2, and the upper and lower dies 1a, 1b and 2 are clamped together along the vertical direction. An air vent 12 having a similar shape to that of the spool 11 is provided on the opposite side from the spool 11 with respect to the cavity 13. In Example 1 as well as Example 2 (described below), the spool 11 may have a diameter, e.g., Φ=about 5 mm, and the air vent 12 may have a diameter, e.g., Φ=about 5 mm.

Figure 6B:
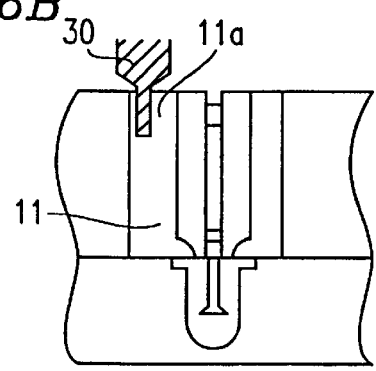

Next, as shown in FIG. 6B, a cylindrical resin injection nozzle 30 is set to the spool 11 in such a manner that a space 11a (e.g., about 0 mm to about 2 mm) is provided between the resin injection nozzle 30 and the inner wall of the spool 11 so that the resin injection nozzle 30 will not close off the spool 11 even when the temperature of the molding die is increased to or above the curing temperature of the thermosetting resin used. However, the resin injection nozzle 30 may partially be placed in close contact with the spool 11 so long as there is a space between the inner wall of the spool 11 and the nozzle 30 (that is, the portion between the inner wall of the spool 11 and the nozzle 30 is at least in a partially open state). In order to prevent curing of the resin within the resin injection nozzle 30, the tip end of the resin injection nozzle 30 is cooled so as to be maintained at a temperature in the range from about 60° C. to about 70° C., for example, i.e., below the curing temperature of the thermosetting resin. The die temperature is set at about 130° C. to about 150° C.

The resin to be used is previously heated at a temperature below the curing temperature thereof (e.g., about 60° C.) so that the viscosity of the resin is lowered to about 3000 cps or less. As shown in FIG. 6C, the low-viscosity resin 31 thus obtained is injected from the resin injection nozzle 30, via the spool 11 and gates 13a, into the cavities 13 at a pressure which is equal to or greater than the self-weight pressure and which is equal to or less than about 2 kg/cm$^2$. The resin injection nozzle 30 is cooled so as to be maintained at a temperature sufficiently below the curing temperature of the thermosetting resin.

Figure 6E:
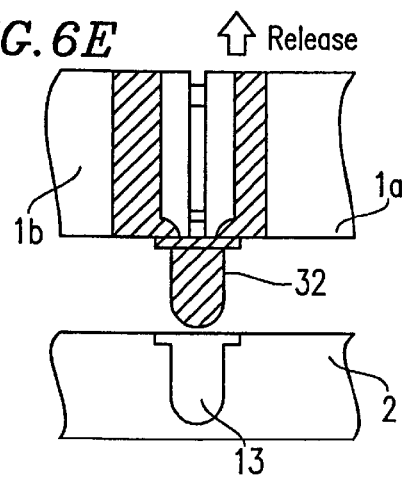
Figure 6C:
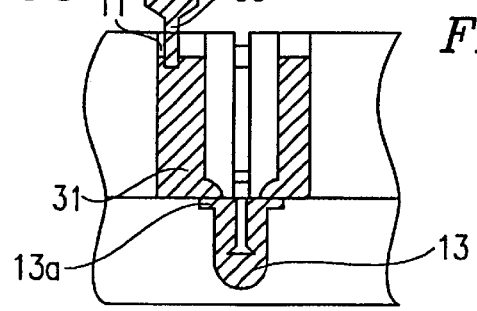
Figure 6F:
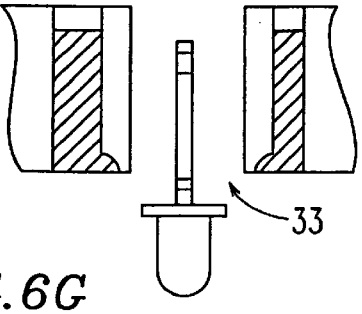
Figure 6D:
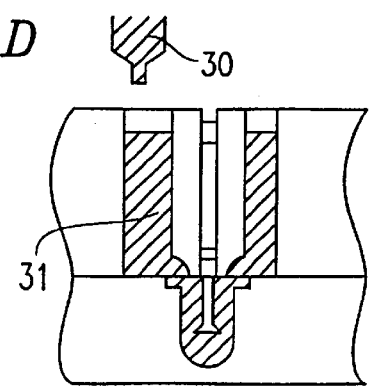

After the resin injection, as shown in FIG. 6D, the resin injection nozzle 30 is removed from the molding die, and the injected resin 31 is allowed to cure within the molding die.

After the resin has cured, as shown in FIG. 6E, the lower die 2 is released, and a product 32 is taken out of the cavity 13. Then, as shown in FIG. 6F, the upper dies 1a and 1b are released, and a final product (LED lamp) 33 is taken out.

Figure 6G:
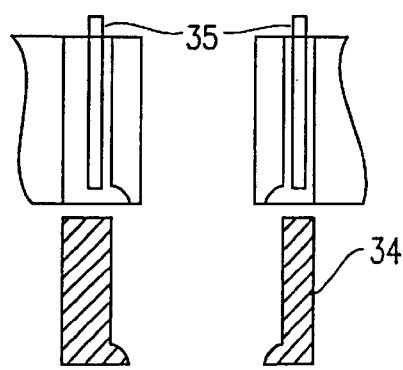

Thereafter, as shown in FIG. 6G, the cured resin pieces 34 left in the upper dies 1a and 1b are removed by means of extrusion pins 35 or the like.

In accordance with the semiconductor device obtained as illustrated in the present example of the invention, the resin reaction time is substantially reduced, and there is no need to store the resin in a frozen state. Therefore, the production cost can be reduced. The use of a thermosetting resin allows for high levels of heat resistance and humidity resistance, which are prerequisites for a semiconductor device encapsulation resin. Furthermore, no substantial sink due to cure-related shrinkage occurs, unlike in the case of casting molding. Moreover, flash formation is controlled, unlike in the case of high-pressure injection molding. Thus, a high-quality semiconductor device product can be obtained according to the present example of the invention.

With a view to protecting the device and the associated wires, the lead frame for an LED lamp which is employed for the low pressure injection molding according to the present example of the invention may additionally be subjected to a pre-dip curing process using the same resin as the resin used for the actual molding, as in conventional injection molding (this also applies to Example 2 described later). Alternatively, in order to prevent void formation within the frame cup, only a pre-dip process may be performed while omitting pre-dip curing.

EXAMPLE 2

In Example 2 of the present invention, a case will be described in which, in order to ensure stable resin injection from a single nozzle into multiple cavities, the temperature of the molding die is first lowered below the curing temperature of the resin used, and thereafter increased to or above the curing temperature of the resin.

First, as shown in FIG. 6A, a lead frame 20 for an LED lamp, to which a semiconductor device has been mounted and wire-bonded, is positioned relative to a lead frame positioning pin 21 provided in an upper right die 1a. Then, an upper left die 1b is attached, and the upper right die 1a and the upper left die 1b are clamped together along the lateral direction. Then, the tip end of the lead frame 20 is inserted into a cavity 13 provided in a lower die 2, and the upper and lower dies 1 and 2 are clamped together along the vertical direction.

Next, as shown in FIG. 6B, a cylindrical resin injection nozzle 30 is set to the spool 11. A space may or be provided between the resin injection nozzle 30 and the inner wall of the spool 11. Alternatively, the resin injection nozzle 30 may partially be placed in close contact with the spool 11 so long as there is a space between the inner wall of the spool 11 and the nozzle 30.

The resin to be used is previously heated at a temperature below the curing temperature thereof (e.g., about 60° C.) so that the viscosity of the resin is lowered to about 3000 cps or less. As shown in FIG. 6C, the low-viscosity resin 31 thus obtained is injected from the resin injection nozzle 30, via the spool 11 and gates 13a, into the cavities 13 at a pressure which is equal to or greater than the self-weight pressure and which is equal to or less than about 2 kg/cm$^2$. The resin molding die and the resin injection nozzle 30 are cooled so as to be maintained at a temperature sufficiently below the curing temperature of the thermosetting resin. For example, the molding die is maintained at about 80° C. to about 90° C., and the resin injection nozzle 30 is maintained at about 60° C. to about 70° C.

After the resin injection, as shown in FIG. 6D, the resin injection nozzle 30 is removed from the molding die, and the die temperature is increased to a temperature which is equal to or greater than the curing temperature of the resin (e.g., 130° C. to about 150° C.). Thus, the injected resin 31 is allowed to cure within the molding die.

After the resin has cured, as shown in FIG. 6E, the lower die 2 is released, and a product 32 is taken out of the cavity 13. Then, as shown in FIG. 6F, the upper dies 1a and 1b are released, and a final product (LED lamp) 33 is taken out.

Thereafter, as shown in FIG. 6G, the cured resin pieces 34 left in the upper dies 1a and 1b are removed by means of extrusion pins 35 or the like.

In accordance with the semiconductor device obtained as illustrated in the present example of the invention, the resin reaction time is substantially reduced, and there is no need to store the resin in a frozen state. Therefore, the production cost can be reduced. The use of a thermosetting resin allows for high levels of heat resistance and humidity resistance, which are prerequisites for a semiconductor device encapsulation resin. Furthermore, no substantial sink due to cure-related shrinkage occurs, unlike in the case of casting molding. Moreover, flash formation is controlled, unlike in the case of high-pressure injection molding. Thus, a high-quality semiconductor device product can be obtained. In addition, resin can be stably injection from a single nozzle into multiple cavities, so that production cycle time can be improved according to the present example of the invention.

As described above, according to the present invention, the resin reaction time can be substantially reduced, and there is no additional cost incurred for the storage or transportation of the resin. Therefore, the cost for producing a semiconductor device according to the present invention can be reduced relative to conventional semiconductor device production processes. Furthermore, no substantial sink due to cure-related shrinkage or wire breakage associated with high injection pressure occurs, and flash formation can be controlled. Furthermore, high levels of heat resistance and humidity resistance, which are prerequisites for a semiconductor device encapsulation resin, can be attained. In addition, it is possible to position a resin portion of a semiconductor device relative to a frame by using the resin molding die according to the present invention, so that the product molding precision can be improved at a stably high level. Since low-pressure molding is possible, the resin molding die according to the present invention can be produced at lower costs than molding dies for use with transfer molding.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a semiconductor device, the method comprising:

setting a semiconductor device in a cavity of a resin molding mold;

injecting a thermosetting resin from a resin injection nozzle into the cavity, through a resin inlet of the resin molding mold and a gate, at a pressure which is equal to or greater than a pressure imposed by the weight of the thermosetting resin and which is equal to or less than about 2 kg/cm$^2$;

curing the thermosetting resin to encapsulate the semiconductor device within the thermosetting resin; and wherein the thermosetting resin has a viscosity of about 3,000 cps or less so that the thermosetting resin can pass through the gate at a pressure which is equal to or greater than the pressure imposed by the weight of the thermosetting resin and which is equal to or less than about 2 kg/cm$^2$.

2. A method according to claim 1, wherein the step of injecting the thermosetting resin comprises injecting the thermosetting resin while heating the resin molding mold to or above a curing temperature of the thermosetting resin.

3. A method according to claim wherein:

the step of injecting the thermosetting resin comprises injecting the thermosetting resin while maintaining the resin molding mold below a curing temperature of the thermosetting resin; and the step of curing the thermosetting resin comprises heating the resin molding mold to or above the curing temperature of the thermosetting resin.

4. A method according to claim 1 wherein the step of injecting the thermosetting resin comprises providing a space between the resin inlet and the resin injection nozzle so as to ensure that the resin inlet is not closed off by the resin injection nozzle when the resin molding mold is heated to or above a curing temperature of the thermosetting resin during injection of the resin.

5. A method according to claim 6, wherein the step of injecting the thermosetting resin comprises cooling the resin injection nozzle so as to be maintained at a temperature sufficiently below a curing temperature of the thermosetting resin.

6. A method according to claim 1, wherein the thermosetting resin is a resin which is obtained by adding a radical polymerization initiator or a cationic polymerization initiator to at least one main component selected from the group consisting of: a liquid epoxy resin; a liquid vinyl ester resin; an allyl resin; and a low-viscosity unsaturated polyester resin.

7. A method according to claim 6, wherein:

the thermosetting resin is a transparent resin; and the semiconductor device is a light receiving/emitting device.

8. A method for producing a semiconductor device comprising:

setting a semiconductor device in a cavity of a resin molding mold;

injecting a thermosetting resin from a resin injection nozzle into the cavity, through a resin inlet of the resin molding mold and a gate, at a pressure which is equal to or greater than a pressure imposed by the weight of the thermosetting resin and which is equal to or less than about 2 $kg/cm^2$;

curing the thermosetting resin to encapsulate the semiconductor device within the thermosetting resin; and wherein the step of injecting the thermosetting resin comprises injecting the thermosetting resin while heating the resin molding mold to or above a curing temperature of the thermosetting resin.

9. A method for producing a semiconductor device comprising:

setting a semiconductor device in a cavity of a resin molding mold;

injecting a thermosetting resin from a resin injection nozzle into the cavity, through a resin inlet of the resin molding mold and a gate, at a pressure which is equal to or greater than a pressure imposed by the weight of the thermosetting resin and which is equal to or less than about 2 $kg/cm^2$;

curing the thermosetting resin to encapsulate the semiconductor device within the thermosetting resin;

wherein the step of injecting the thermosetting resin comprises injecting the thermosetting resin while maintaining the resin molding mold below a curing temperature of the thermosetting resin; and the step of curing the thermosetting resin comprises heating the resin molding mold to or above the curing temperature of the thermosetting resin.

10. A method for producing a semiconductor device comprising:

setting a semiconductor device in a cavity of a resin molding mold;

injecting a thermosetting resin from a resin injection nozzle into the cavity, through a resin inlet of the resin molding mold and a gate, at a pressure which is equal to or greater than a pressure imposed by the weight of the thermosetting resin and which is equal to or less than about 2 $kg/cm^2$;

curing the thermosetting resin to encapsulate the semiconductor device within the thermosetting resin; and wherein the step of injecting the thermosetting resin comprises providing a space between the resin inlet and the resin injection nozzle so as to ensure that the resin inlet is not closed off by the resin injection nozzle when the resin molding mold is heated to or above a curing temperature of the thermosetting resin during injection of the resin.

11. A method for producing a semiconductor device comprising:

setting a semiconductor device in a cavity of a resin molding mold;

injecting a thermosetting resin from a resin injection nozzle into the cavity, through a resin inlet of the resin molding mold and a gate, at a pressure which is equal to or greater than a pressure imposed by the weight of the thermosetting resin and which is equal to or less than about 2 $kg/cm^2$;

curing the thermosetting resin to encapsulate the semiconductor device within me thermosetting resin; and wherein the thermosetting resin is heated before injecting the thermosetting resin into the cavity so as to reduce a viscosity of the thermosetting resin compared to the viscosity of the thermosetting resin before heating.

12. The method of claim 11, wherein the thermosetting resin is heated at a temperature below the curing temperature before injecting the thermosetting resin into the cavity.

13. The method of claim 11, wherein the thermosetting resin is heated at a temperature of about 60 degrees C. before injecting the thermosetting resin into the cavity.

14. The method of claim 11, wherein the mold is at a temperature of from about 130–150 degrees C. during at least part of said injecting.

* * * * *